United States Patent
Hattori

(10) Patent No.: US 7,460,571 B2
(45) Date of Patent: Dec. 2, 2008

(54) LASER CONTROL APPARATUS AND CONTROL METHOD THEREOF

(75) Inventor: Keita Hattori, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 16 days.

(21) Appl. No.: 11/798,577

(22) Filed: May 15, 2007

(65) Prior Publication Data

US 2007/0274355 A1    Nov. 29, 2007

(30) Foreign Application Priority Data

May 24, 2006  (JP)  ............... 2006-144540

(51) Int. Cl.
*H01S 3/10* (2006.01)
*H01S 3/13* (2006.01)
*H01S 3/00* (2006.01)

(52) U.S. Cl. ............... 372/26; 372/29.015; 372/38.07

(58) Field of Classification Search ............ 372/26, 372/29.01, 29.015, 29.02, 38.02, 38.07
See application file for complete search history.

(56) References Cited

U.S. PATENT DOCUMENTS 5,337,323 A    8/1994   Rokugawa et al.

FOREIGN PATENT DOCUMENTS

JP    06-085363    3/1994
JP    P3130571    11/2000

*Primary Examiner*—Armando Rodriguez
(74) *Attorney, Agent, or Firm*—McGinn IP Law Group, PLLC

(57) ABSTRACT

A laser control apparatus and control method thereof includes multiple laser elements, a photodetector for monitoring optical outputs of the laser elements, a modulation. circuit for modulating with respect to each laser element based on data, a first drive source for applying a bias current to each laser element, a second drive source for generating a modulation current in the modulation circuit, and a controller for controlling the first drive source and the second drive source to couple an amount of a variation of a drive current as a test current to the bias current and the modulation current and for controlling the bias current according to an amount of variation of the optical output which occurs by coupling of the test current and an amount of the bias current.

8 Claims, 8 Drawing Sheets

LASER CONTROL APPARATUS AND CONTROL METHOD THEREOF

The present application is based on Japanese Patent Application No. 2006-144540 filed on May 24, 2006, the entire contents of which are incorporated herein by reference.

BACKGROUND OF THE INVENTION

1. Field of the Invention

This invention relates to a laser control apparatus and a control method which monitors an optical output from multiple laser elements by a photodetector, and controls each laser element by a drive current including a bias current and a modulation current based on a monitored result.

2. Description of the Related Art

In an optical interface for an optical communication system, a laser element (e.g., a laser diode (LD)) may be used as an emitting source. In an optical communication, an optical output of the emitting source should be stabilized to reduce an occurrence of a communication error. However, it is known that an emitting characteristic of the LD is varied easily by ambient temperature. Generally, the optical output of the LD may be stabilized by detecting the optical output of the LD by a photodiode (PD) and controlling a bias current of the LD to keep a light receiving output constant.

However, in some communication methods, the optical output of the LD cannot be stabilized by only controlling the bias current. A modulation circuit which is allowed to adjust a modulation current amplitude in addition to adjusting the bias current is known (e.g., see Japanese Patent Publication JP-A-1994-85363, paragraphs 0008-0013).

Further, a laser array apparatus including integrated multiple LDs may be used as the emitting source for an optical transmission of a multiple channels. In this case, if the optical output of each LD is controlled, a circuit configuration becomes complex.

Consequently, a simplified laser array is disclosed in Japanese Patent JP-B-3130571 (paragraphs 0012-0019, FIG. 1). In this laser array apparatus, one of multiple laser units is set as a reference laser unit, a feedback control of a drive current is performed only about the reference laser unit, and other laser units are controlled by following the control of the reference laser unit's drive current. Consequently, the laser array apparatus is attempted to be simplified.

In this constitution, however, since the optical output of only the reference laser unit of the multiple laser units is monitored, when a variation of a thermal characteristic between the laser units is great, it is difficult to control exactly the laser units other than the reference laser unit.

Therefore, prior to the present invention, there has been no conventional system or method which can provide a laser control apparatus or a control method thereof which can control each optical output of multiple laser elements exactly according to a variation of a thermal characteristic between multiple laser elements or a temperature change.

SUMMARY OF THE INVENTION

In view of the foregoing and other exemplary problems, drawbacks, and disadvantages of the conventional methods and structures, an exemplary feature of the present invention is to provide a laser control apparatus and a control method thereof which is allowed to control each optical output of multiple laser elements exactly according to a variation of a thermal characteristic between multiple laser elements or a temperature change.

According to one exemplary aspect of the invention, a laser control apparatus includes:

a plurality of laser elements;

a photodetector for monitoring optical outputs of the laser elements;

a modulation circuit for modulating with respect to each of the laser elements based on data;

a first drive source for applying a bias current to each of the laser elements;

a second drive source for generating a modulation current in the modulation circuit, the modulation current being applied to each of the laser elements; and a controller for controlling the first drive source and the second drive source to couple an amount of a variation of a drive current as a test current to the bias current and the modulation current, and for controlling the bias current according to an amount of variation of the optical output which occurs by coupling of the test current and an amount of the bias current.

According to another exemplary aspect of the invention, a laser control method for monitoring an optical output of a plurality of laser elements by a photodetector and driving the laser elements by a drive current including a bias current and a modulation current based on a monitored optical output and data includes:

driving the laser elements individually by coupling an amount of a variation of a drive current as a test current to the drive current;

monitoring the optical output of the laser elements by the photodetector; and controlling the bias current according to an amount of variation of the optical output which occurs by coupling of the test current and the bias current for keeping an average optical output of the laser elements constant.

The above exemplary modifications may be made alone or in any combination thereof.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 5A is a schematic characteristic diagram showing a relation of an inverse of the differential efficiency $\eta$ and a temperature, FIG. 5B is a schematic characteristic diagram showing a relation of the bias current $I_b$ and a temperature when the average optical output $P_{ave}$ is constant, and FIG. 5C is a schematic characteristic diagram showing a relation of the bias current $I_b$ in FIG. 5B and the inverse of the differential efficiency $\eta$;

DETAILED DESCRIPTION OF THE EXEMPLARY EMBODIMENTS

Figure 1:
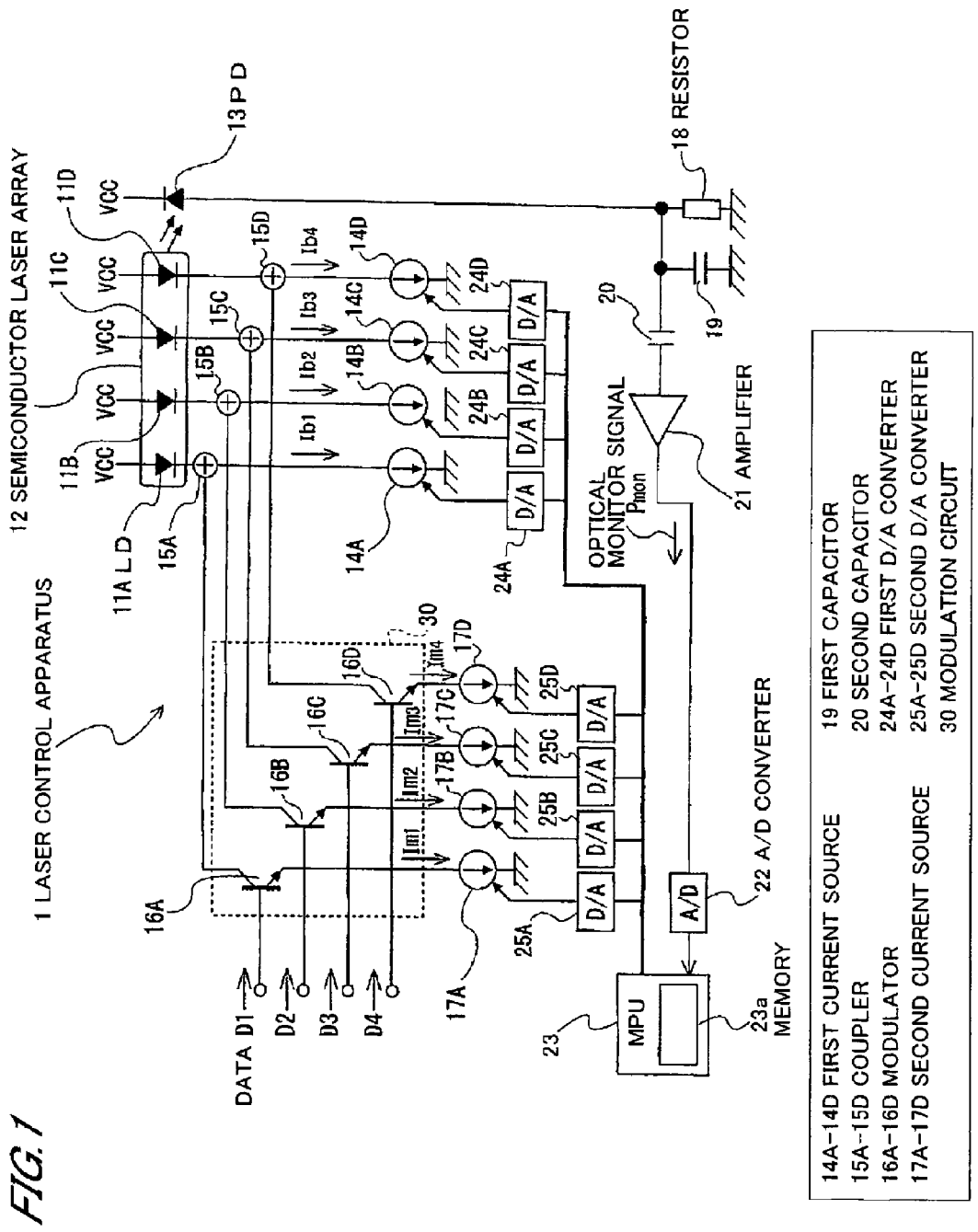
FIG. 1 is a schematic circuit diagram showing a laser control apparatus in a first exemplary embodiment according to the present invention.

Referring now to the drawings, and more particularly to FIGS. 1-8, there are shown exemplary embodiments of the methods and structures according to the present invention.

Exemplary Embodiment 1

Constitution of Laser Control Apparatus

FIG. 1 shows a laser control apparatus in a first exemplary embodiment according to the present invention. This laser control apparatus 1 includes a multi-channel type semiconductor laser array 12 including multiple LDs 11A-11D as a laser element in which an end thereof is connected to a voltage supply Vcc, a photodiode (PD) 13 as a photodetector for collectively monitoring optical outputs from LDs 11A-11D, first current sources (first drive sources) 14A-14D connected between a lower electric potential end of the LDs 11A-11D and ground, couplers 15A-15D formed in each line between the first current sources 14A-14D and LDs 11A-11D, modulators 16A-16D for modulating with data D1-D4 and applying a modulation output to the couplers 15A-15D, second current sources (second drive sources) 17A-17D connected between the modulators 16A-16D and ground, a resistor 18 connected between an end (lower electric potential end) of the PD 13 and ground, a first capacitor 19 connected to the resistor 18 in parallel, a second capacitor 20 connected to a higher electric potential end of the first capacitor 19, an amplifier 21 for amplifying a signal from the second capacitor 20, an analog/digital (A/D) converter 22 for converting an analog signal of the amplifier 21 to a digital signal, a micro processor unit (MPU) 23 as a control part which operates based on an output signal from the A/D converter 22, first digital/analog (D/A) converters 24A-24D for converting a digital signal outputted from the MPU 23 to an analog signal and outputting the analog signal to the first current sources 14A-14D, and second D/A converters 25A-25D for converting the digital signal outputted from the MPU 23 to the analog signal and outputting the analog signal to the second current sources 17A-17D.

The PD 13 is connected so that the PD 13 will generate an output current when the optical output is outputted from the LDs 11A-11D and will drop a voltage of the resistor 18 according to an amount of received light.

The couplers 15A-15D include a circuit for coupling the bias currents $I_{b1}$-$I_{b4}$ supplied by the first current sources 14A-14D and the modulation currents $I_{m1}$-$I_{m4}$ flowing from the modulators 16A-16D by alternating-current (AC) coupling or direct-current (DC) coupling.

The modulators 16A-16D include a modulation circuit 30. Each of the modulators 16A-16D includes a transistor (e.g., NPN transistor) and performs a switching according to a logic "0" or a logic "1" of the data D1-D4 which is inputted to a base. Collectors of the transistors are connected to the couplers 15A-15D, and emitters of the transistors are connected to the second current sources 17A-17D.

The first current sources 14A-14D supply the bias current $I_{b1}$-$I_{b4}$ to the LDs 11A-11D and the second current sources 17A-17D supply the modulation currents $I_{m1}$-$I_{m4}$ to the modulators 16A-16D.

The first capacitor 19 smoothes an output voltage of the resistor 18 to detect a summation of an average optical output $P_{ave}$ of the LDs 11A-11D. Although a time constant thereat must be sufficiently longer than a period of a data signal, the time constant must be sufficiently shorter than a period of a test current at the same time. Further, the second capacitor 20 extracts a variation of a summation of the average optical output $P_{ave}$ of the LDs 11A-11D which is caused by the test current, and a time constant thereat must be sufficiently longer, than a period of the test current.

The MPU 23 includes a memory 23a in addition to a central processing unit (CPU), etc. (not shown), and operates according to a program stored in the memory 23a.

The LDs 11A-11D constitute the semiconductor laser array 12 by being one unit, and can generate an optical output signal of multiple channels when the LDs 11A-11D are driven respectively.

Figure 2:
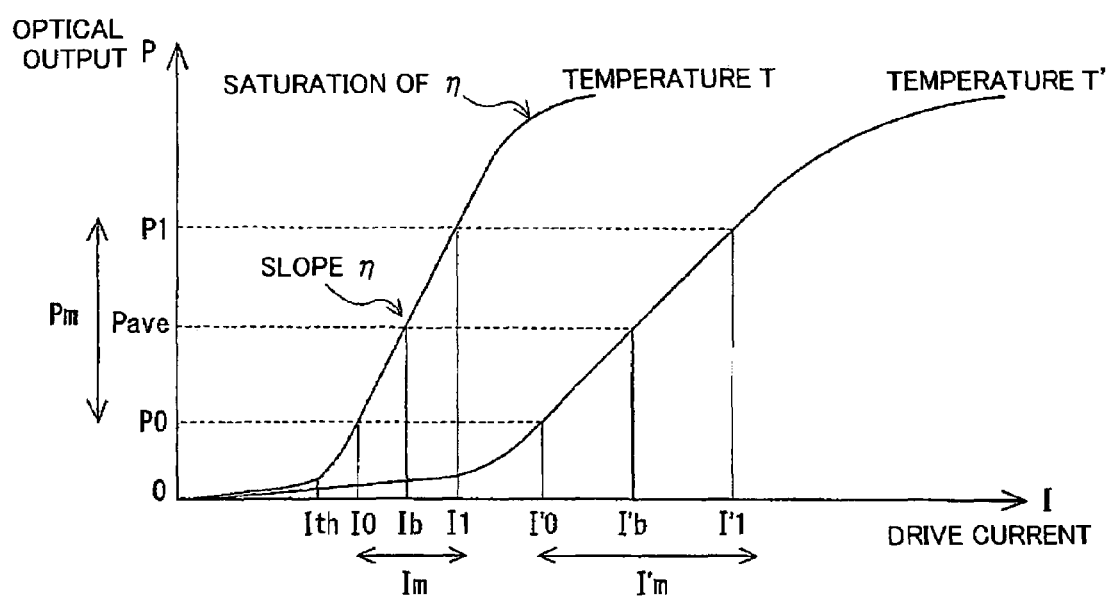
FIG. 2 is a characteristic view showing a characteristic of an optical output against a drive current about a laser diode.

FIG. 2 shows a characteristic of an optical output against a drive current about a laser diode, particularly, which shows the characteristic of one exemplary one of the LDs 11A-11D. When the modulation current $I_m$ is in a region less than a threshold $I_{th}$ (spontaneous emission region), since the optical output is caused by only spontaneous emission, the optical output is very low.

On the other hand, when the modulation current $I_m$ is in a region more than the threshold $I_{th}$ (stimulated emission region), a relation of the modulation current $I_m$ and the emission output is linear. A slope in the stimulated emission region, in other words, a ratio of an amount of minimal change of the emission output P and the modulation current $I_m$, is referred to as a "differential efficiency $\eta$". Further, when the modulation current $I_m$ is increased, the differential efficiency $\eta$ becomes less. In other words, a saturation of the differential efficiency $\eta$ occurs.

When the optical signal is transmitted strongly or weakly by the optical output of the LD, the LD should perform in a region in which the differential efficiency $\eta$ is constant so that a transmission characteristic is not made worse by signal waveform distortion. Therefore, the LD is not exemplarily driven with a smaller amount of current than $I_{th}$ or a large amount of current in which the differential efficiency $\eta$ is saturated.

Further, as shown in FIG. 2, the differential efficiency $\eta$ and the threshold $I_{th}$ are varied by a change of ambient temperature. Therefore, when a temperature T is changed to T', a control to change the bias current $I_b$ to a $I'_b$ is needed for keeping the average optical output $P_{ave}$ constant.

Operation of the Laser Control Apparatus

Figure 3:
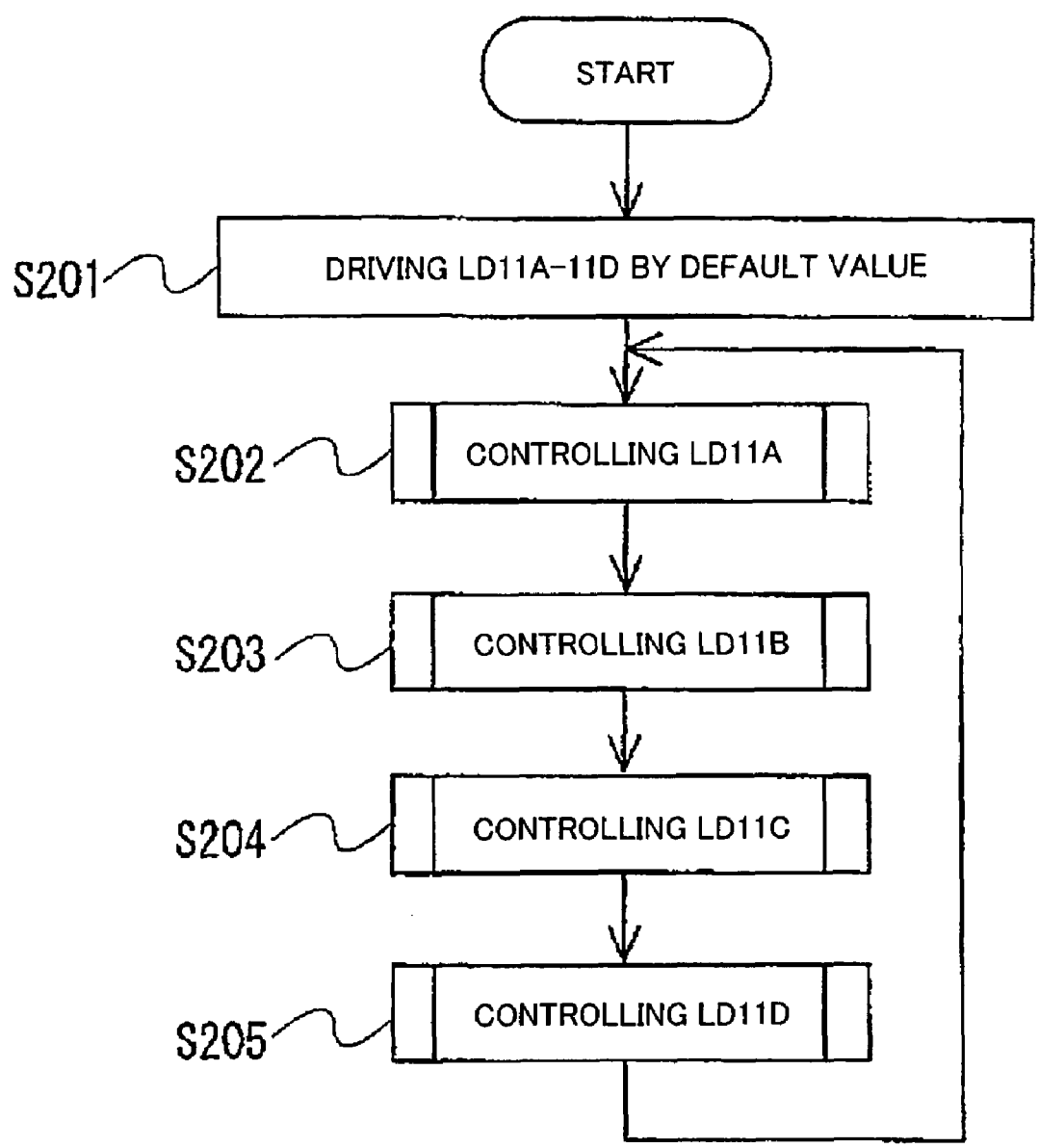
FIG. 3 is a flowchart showing a control of the laser control apparatus in a first exemplary embodiment according to the present invention.
Figure 4:
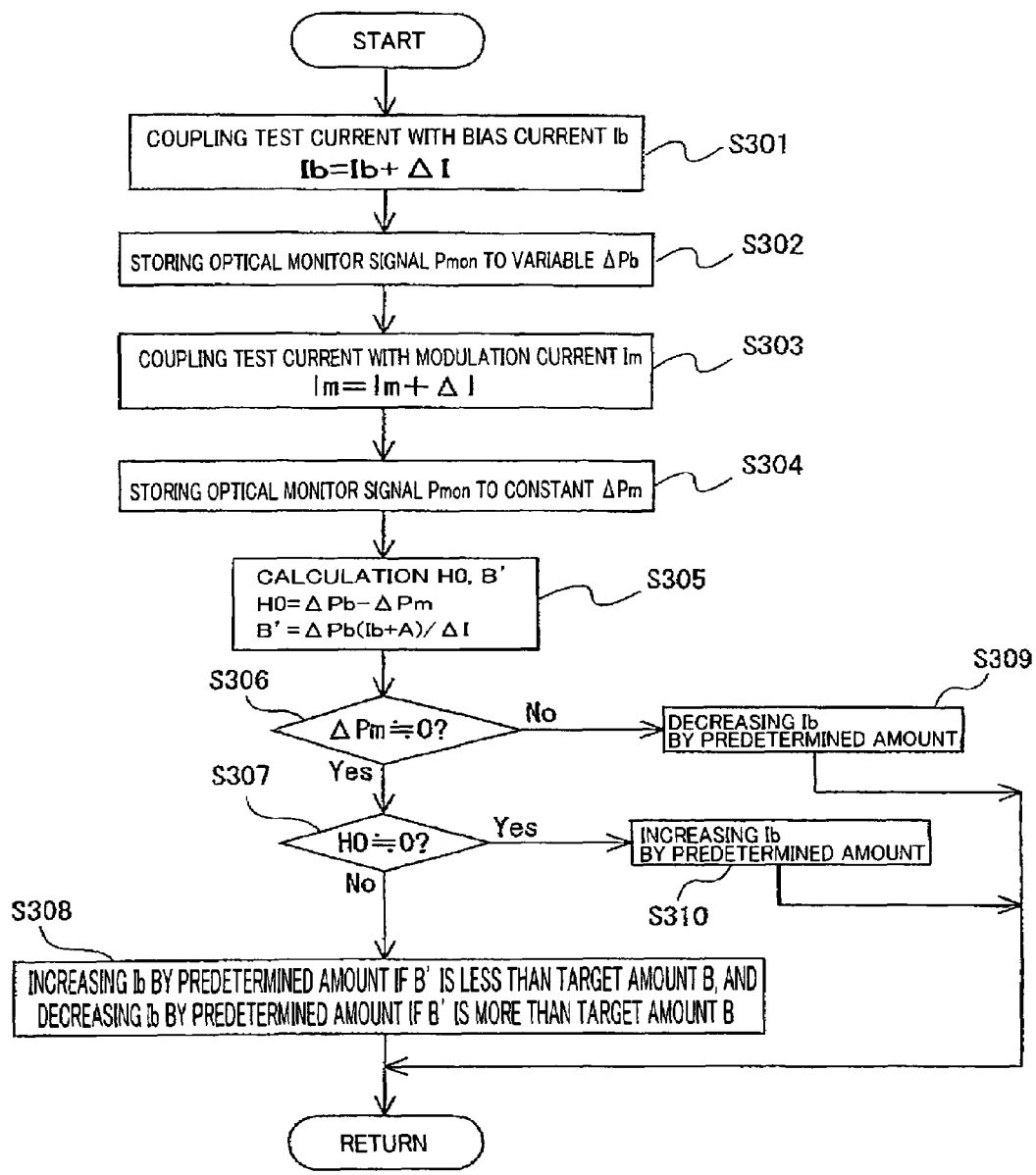
FIG. 4 is a flowchart showing a description of the control of one laser diode shown in FIG. 3.

FIG. 3 and FIG. 4 are flowcharts showing a process by the MPU 23. FIG. 3 shows a whole processing, and FIG. 4 shows a description of a control of each LD shown in FIG. 3. The operation of the laser control apparatus is explained below referring to FIGS. 1 to 4. The optical outputs corresponding to the logic "0" and "1" of the signal are $P_0$ and $P_1$, respectively, and the drive currents are $I_0$ and $I_1$, respectively. The differential efficiency in the vicinity of the drive current $I_0$ and $I_1$ are $\eta_0$ and $\eta_1$, respectively.

As shown in FIG. 3, the MPU 23 drives all of LDs 11A-11D by the predetermined bias currents $I_{b1}$-$I_{b4}$ and default values of the modulation currents $I_{m1}$-$I_{m4}$ (S201). Then, the drive control is repeatedly performed in order of the LD 11A, the LD 11B, the LD 11C, and the LD 11D (S202-S205).

When the first and second current sources 14A-14D and 17A-17D are controlled so that the predetermined bias currents $I_{b1}$-$I_{b4}$ and the predetermined modulation currents $I_{m1}$-$I_{m4}$ will be supplied, and when the data D1-D4 are inputted into the modulators 16A-16D, the LDs 11A-11D emit a laser light including the optical output $P_0$ and $P_1$ according to the logic "0" and "1" of the data D1-D4.

When the LDs 11A-11D are driven in the region over the threshold $I_{th}$ (i.e., stimulated emission region), a relation of the drive current $I_0$ and $I_1$, the bias current $I_b$ and the modulation current $I_m$ is described as a following equation. In this case, unless otherwise stated, "$I_b$" and "$I_m$" express one of the bias currents $I_{b1}$-$I_{b4}$ and the modulation currents $I_{m1}$-$I_{m4}$.

When the bias current $I_b$ and the modulation current $I_m$ are AC-coupled by the couplers 15A-15D, the relation is described by equation (1a).

$$I_0 = I_b - I_m/2, \ I_1 = I_b + I_m/2 \qquad (1a)$$

Further, when the $I_b$ and the $I_m$ is DC-coupled by the couplers 15A-15D, the relation is described by equation (1b).

$$I_0 = I_b, \ I_1 = I_b + I_m \qquad (1b)$$

Once the bias currents $I_{b1}$-$I_{b4}$ and the modulation currents $I_{m1}$-$I_{m4}$ are determined, the drive currents $I_0$ and $I_1$ are uniquely determined by the equations (1a) or (1b). Therefore, when the bias currents $I_{b1}$-$I_{b4}$ and the modulation currents $I_{m1}$-$I_{m4}$ are set to an appropriate value by the MPU 23, the predetermined optical outputs $P_0$ and $P_1$ can be provided.

The optical output P of the LDs 11A-11D is monitored by the PD 13. The PD 13 outputs an optical current in proportion to a total of the optical output P of the LDs 11A-11D. The optical current is transformed to an amount of voltage by the resistor 18. The voltage generated in the resistor 18 is removed a modulation component of the optical output therefrom by the first capacitor 19, and a summation of the average optical output $P_{ave}$ of the LDs 11A-11D is detected.

Additionally, a variation of the average optical output $P_{ave}$ of the LDs 11A-11D which is caused by a variation $\Delta I$ of the laser drive current is extracted by the second capacitor 20. The average optical output $P_{ave}$ from the second capacitor 20 is amplified by the amplifier 21 and outputted as an optical monitor signal $P_{mon}$ (an amount of the variation of the optical output). The optical monitor signal $P_{mon}$ is transformed to a digital signal by the A/D converter 22 and inputted to the MPU 23.

Calculation of Differential Efficiency

The MPU 23 controls the first current sources 14A-14D and the second current sources 17A-17D and couples the test current with the bias currents $I_{b1}$-$I_{b4}$ and the modulation currents $I_{m1}$-$I_{m4}$. A case in which the bias current $I_b$ and the modulation current $I_m$ is AC-coupled is mentioned below.

Firstly, the test current, an amplitude of which is $\Delta I$, is coupled with the bias current $I_{b1}$-$I_{b4}$ (S301 in FIG. 4). In this case, the test current ($\Delta I$) is coupled with the drive current $I_0$ and $I_1$ of each of the LDs 11A-11D.

Since the optical monitor signal $P_{mon}$ outputted from the amplifier 21 is the amount of the variation of the average optical output $P_{ave}$, an average of the variation of the optical output near to the drive current $I_0$ and $I_1$ is detected. This optical monitor signal $P_{mon}$ is stored in the memory 23a as a variable $\Delta P_b$ by the MPU 23 (S302) This variable is described as:

$$\Delta P_b = \{(\eta_1 + \eta_0)/2\} * \Delta I \qquad (2)$$

Since the differential efficiencies $\eta_0$ and $\eta_1$ correspond with each other as far as the LDs 11A-11D are driven in the region where the differential efficiency $\eta$ is constant as shown in FIG. 2, it turns out that the variable $\Delta P_b$ is a value with respect to the differential efficiency $\eta$, according to the above equation (2).

Secondly, the test current of the amplitude $\Delta I$ is coupled with the modulation currents $I_{m1}$-$I_{m4}$ by the MPU 23 (S303). In this case, ($-\Delta I/2$) is coupled with the drive current $I_0$ and ($+\Delta I/2$) is coupled with the drive current $I_1$, according to the above equation (1a). This optical monitor signal $P_{mon}$ is stored in the memory 23a as the variable $\Delta P_m$ (i.e., a saturation degree of the differential efficiency $\eta$) by the MPU 23 (S304). The variable $\Delta P_m$ is described as a following equation.

$$\Delta P_m = \{(\eta_1 - \eta_0)/2\} * \Delta I \qquad (3)$$

Since the differential efficiencies $\eta_0$ and $\eta_1$ correspond with each other as far as the LDs 11A-11D are driven in the region where the differential efficiency $\eta$ is constant, $\Delta P_m$ is almost zero according to the above equation (3). When the LDs 11A-11D are driven in the saturation region of the differential efficiency $\eta$, since the differential efficiencies $\eta_0$ and $\eta_1$ have a relationship of $\eta_1 < \eta_0$, the variable $\Delta P_m$ can be used as an indicator of the saturation degree of the differential efficiencies $\eta$.

Next, a value (a variable $H_0$) with respect to the differential efficiencies $\eta$ is calculated by the MPU 23 according to:

$$H_0 = \Delta P_b - \Delta P_m (= \eta_0 * \Delta I) \qquad (4)$$

When the drive current $I_0$ is less than the threshold $I_{th}$, $\eta_0$ (the variable $H_0$) is almost zero. Therefore, the variable $H_0$ can be used as an indicator showing whether the drive current $I_0$ is less than the threshold $I_{th}$ or not.

Calculation in DC-coupling

A calculation method of the variable $\Delta P_m$ and $H_0$ is mentioned, when the bias current $I_b$ and the modulation current $I_m$ is DC-coupled. In this case, $\Delta P_b$ can be calculated by the same method as the AC-coupling as discussed above.

When ($+\Delta I$) is coupled with the bias current $I_b$ and ($-\Delta I$) is coupled with the modulation current $I_m$ at the same time, the amplitude $\Delta I$ is coupled with the drive current $I_0$ according to the above equation (1b).

On the other hand, since the test current coupled with the bias current $I_b$ and the modulation current $I_m$ are negated with each other, the drive current $I_1$ is equal to that in which nothing is coupled. Therefore, in this case, the detected optical monitor signal $P_{mon}$ is ($\eta_0 * \Delta I$) (I.e., the variable $H_0$ according to the equation (4)).

When the amplitude $\Delta I$ is coupled with the modulation current $I_m$, since the amplitude $\Delta I$ is coupled with only the drive current $I_1$ according to the above equation (1b), the detected optical monitor signal $P_{mon}$ is ($\eta_1 * \Delta I$). Therefore, a half of a differential between ($\eta_1 * \Delta I$) and the variable $H_0$ ($= \eta_0 * \Delta I$) is the variable $\Delta P_m$ according to the above equation (3).

Control of LD

The MPU 23 controls the bias currents $I_{b1}$-$I_{b4}$ according to the variables $\Delta P_b$, $\Delta P_m$ and $H_0$ (S305) which are calculated as discussed above so that the average optical output $P_{ave}$ of the LDs 11A-11D will be constant.

In this control, whether the LDs 11A-11D are driven in the region where the differential efficiency $\eta$ is constant, according to the variables $\Delta P_m$ and $H_0$, is checked (S306, S307) When the drive current $I_1$ is too much and the $\eta_1$ is in the saturation region of the differential efficiency $\eta$, the bias currents $I_{b1}$-$I_{b4}$ are decreased by a predetermined amount. Further, when the drive current $I_0$ is less than the threshold $I_{th}$, the bias currents $I_{b1}$-$I_{b4}$ are increased by a predetermined amount. Repeating such controls, the drive currents $I_0$ and $I_1$ can be entered in the region where the differential efficiency $\eta$ is constant. When the LDs 11A-11D are driven in the region where the relation of $\eta_0=\eta_1$ ($=\eta$) is implemented and the differential efficiency $\eta$ is constant, the MPU 23 performs a control to keep the average optical output $P_{ave}$ constant. This control is mentioned below.

In this exemplary embodiment, since the optical outputs of the LDs 11A-11D of the semiconductor laser array 12 are detected by only PD 13, the average optical output $P_{ave}$ of each of the LDs 11A-11D cannot be detected directly. Consequently, by using a characteristic of the LD as shown in FIGS. 5A-5C, a control to keep the average optical output $P_{ave}$ constant is operated.

Figure 5A:
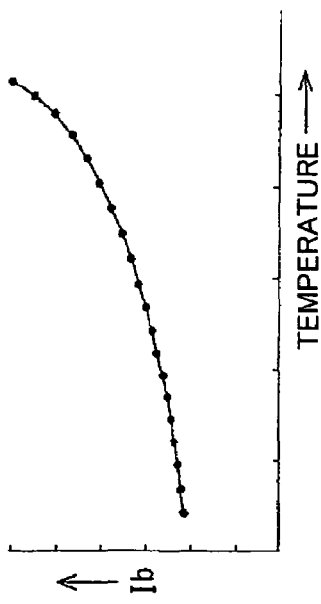
FIGS. 5A-5C shows a relation of $1/\eta$ according to a temperature of the laser diode and the bias current.
Figure 5B:
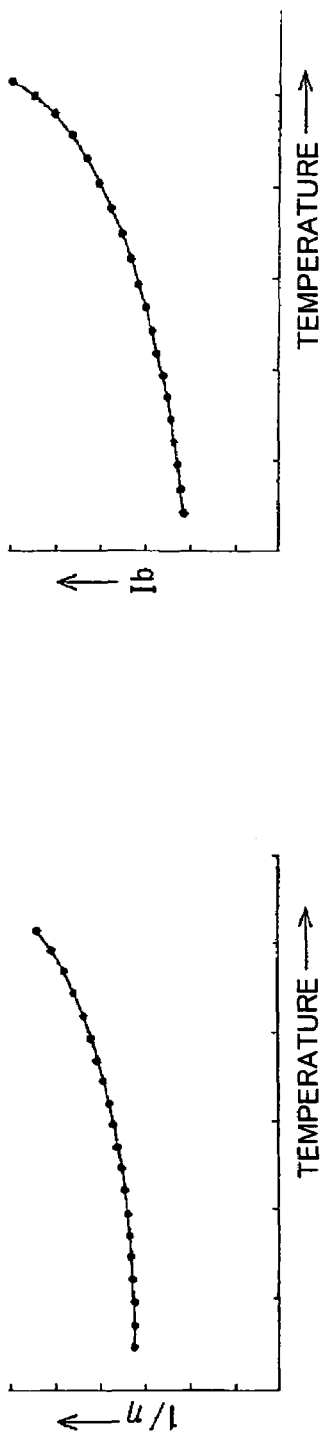
Figure 5C:
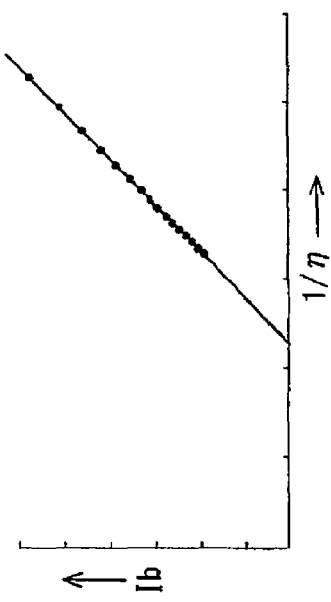

FIGS. 5A-5C show a relation of $1/\eta$ and the bias current according to a temperature of the laser diode. FIG. 5A is a schematic characteristic diagram showing a relation of an inverse of the differential efficiency $\eta$ and a temperature, FIG. 5B is a schematic characteristic diagram showing a relation of the bias current $I_b$ and a temperature when the average optical output $P_{ave}$ is constant, FIG. 5C is a schematic characteristic diagram showing a relation of the bias current $I_b$ in FIG. 5B and the inverse of the differential efficiency $\eta$.

As shown in FIG. 5A, the differential efficiency $\eta$ is decreased with an increase of the temperature (i.e., $1/\eta$ is increased with an increase of the temperature). Thereby, as shown in FIG. 5B, to keep the optical output P of the LDs 11A-11D constant, the bias current $I_b$ is increased with the increase of the temperature. Further, as shown in FIG. 5C, when the optical output P is constant, $1/\eta$ and the bias current $I_b$ have a strong correlation and are described by first-order approximation as a following equation which uses constants A and B which are not affected by temperature. In this case, the equation below shows one of the bias currents $I_{b1}$-$I_{b4}$.

$$I_b = -A + B/\eta \quad (5)$$

In the above equation (5), when the average optical output $P_{ave}$ is constant, a following relation between the differential efficiency $\eta$, the bias current $I_b$, and the constant A holds:

$$\eta(I_b+A) = B (=\text{constant}) \quad (6)$$

Therefore, when the LDs 11A-11D are controlled so that a left-hand side of the equation (6) will be constant, the average optical output $P_{ave}$ can be constant. Further, from the above equation (2), the differential efficiency $\eta(=\eta_0=\eta_1)$ is $\Delta P_b/\Delta I$.

As mentioned above, the MPU 23 calculates the left-hand side of the equation (6), that is, $\eta(I_b+A) = (I_b+A)*\Delta P_b/\Delta I = B'$ by using the detected differential efficiency $\eta$, the known bias currents $I_{b1}$-$I_{b4}$, and the predetermined constant A (S305).

Additionally, when the variable $\Delta P_m$, which is stored in the step S306, is not considered as almost zero (S306: NO), the MPU 23 evaluates that the differential efficiency $\eta_1$ is saturated, and decreases the bias currents $I_{b1}$-$I_{b4}$ by the predetermined amount (S309). Further, when the variable $\Delta P_m$ is considered as almost zero (S306: YES), the MPU 23 evaluates that the differential efficiency $\eta_1$ is not saturated, and moves to a step S307. In the step S307, when the variable $H_0$ related to $\eta_0$ is considered as almost zero (S307: YES), the MPU 23 evaluates that the drive current is less than the threshold $I_{th}$, and increases the bias currents $I_{b1}$-$I_{b4}$ by the predetermined amount (S310). Further, when the variable $H_0$ is not considered as almost zero (S307: NO), the MPU 23 moves to a step S308.

The MPU 23 compares the variable B and B', and performs a control to decrease the bias currents $I_{b1}$-$I_{b4}$ in the case of B'>B or increase the bias currents $I_{b1}$-$I_{b4}$ in the case of B>B', and keeps the average optical output $P_{ave}$ constant (S308). Performing this control for each of the LDs 11A-11D, the average optical output $P_{ave}$ of the LDs 11A-11D can be controlled in the predetermined amount.

Although the constants A and B have a variation with respect to each LD, the constants A and B are preliminarily set by measuring about each LD and stored in the memory 23a, so that the average optical output $P_{ave}$ can be adjusted for each LD individually. Further, when the threshold $I_{th}$ of the LD is almost zero (generally called a "zero-threshold laser"), since the constant A is considered as almost zero, the constant A does not need to be set for each LD.

Advantage of the First Exemplary Embodiment

According to the first exemplary embodiment, since the optical outputs of the multiple LDs 11A-11D are monitored by only PD 13 and the LD characteristic as shown in FIGS. 5A-5C is used, the optical output (the average and the modulation amplitude) of the LDs 11A-11D can be controlled individually and exactly according to the characteristic variation and temperature change of the LDs 11A-11D.

Additionally, since the bias current $I_b$ of the LDs 11A-11D is increased or decreased by checking whether the differential efficiency no is less than the threshold $I_{th}$ or not and whether the differential efficiency $\eta_1$ is saturated or not, based on a result which is detected by monitoring of the optical output by the PD 13, the distortion of the optical signal waveform can be prevented, and a degradation of a transmission characteristic can be prevented.

Exemplary Embodiment 2

Figure 6:
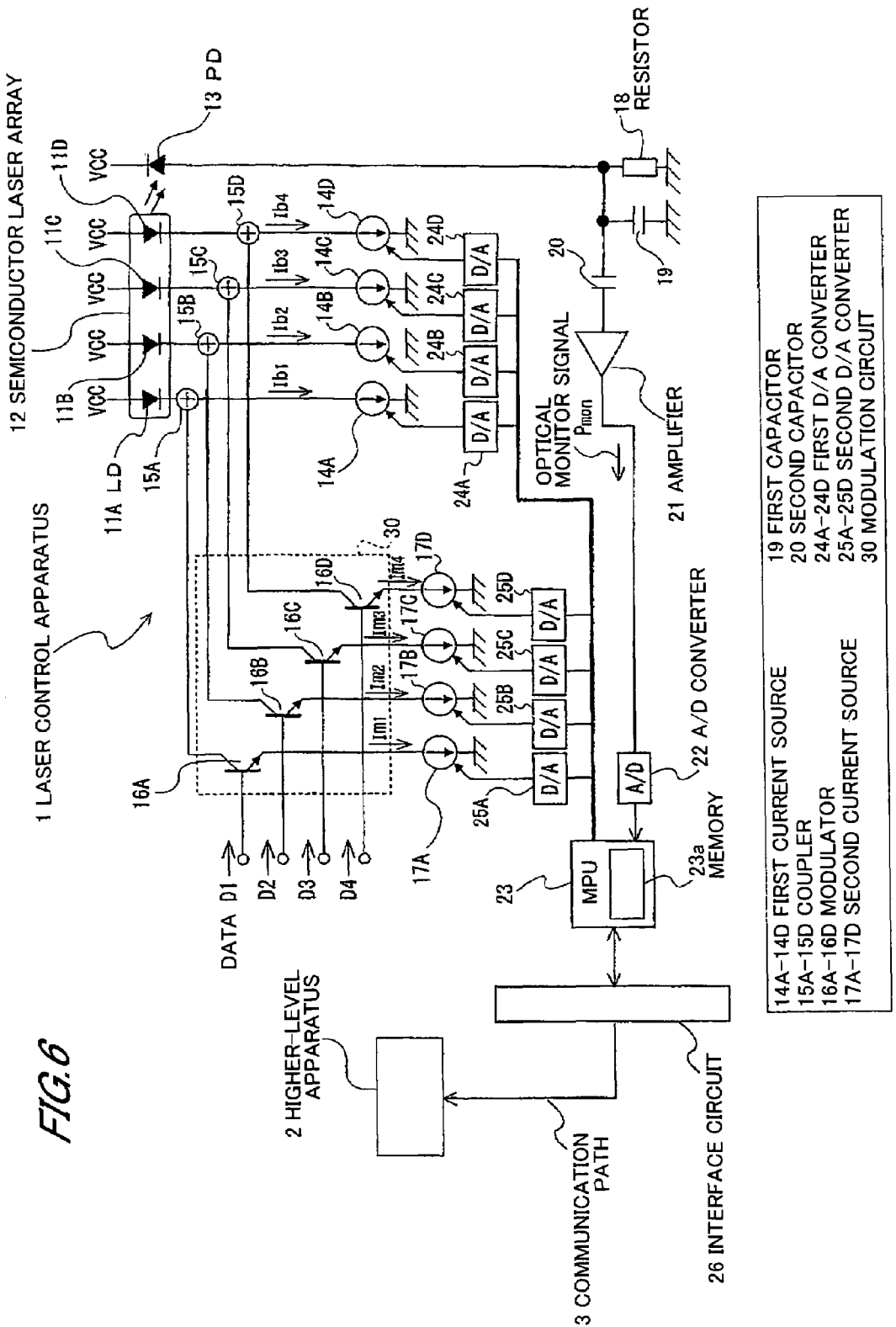
FIG. 6 is a schematic circuit diagram showing a laser control apparatus in a second exemplary embodiment according to the present invention.

FIG. 6 shows a laser control apparatus in a second exemplary embodiment according to the present invention. In the laser control apparatus of this exemplary embodiment, the average optical output $P_{ave}$ of the LDs 11A-11D is obtained by an amount of the left-hand side of the equation (6) (i.e., an amount of $\eta(I_b+A)=B'$), and the average optical output $P_{ave}$ is provided to a higher-level apparatus 2 as a monitor amount of the average optical output. All except a constitution explained above are the same as the first exemplary embodiment.

As shown in FIG. 6, an interface circuit 26 is connected to the MPU 23, and the higher-level apparatus 2 is connected to the interface circuit 26 through a communication path 3.

Figure 7:
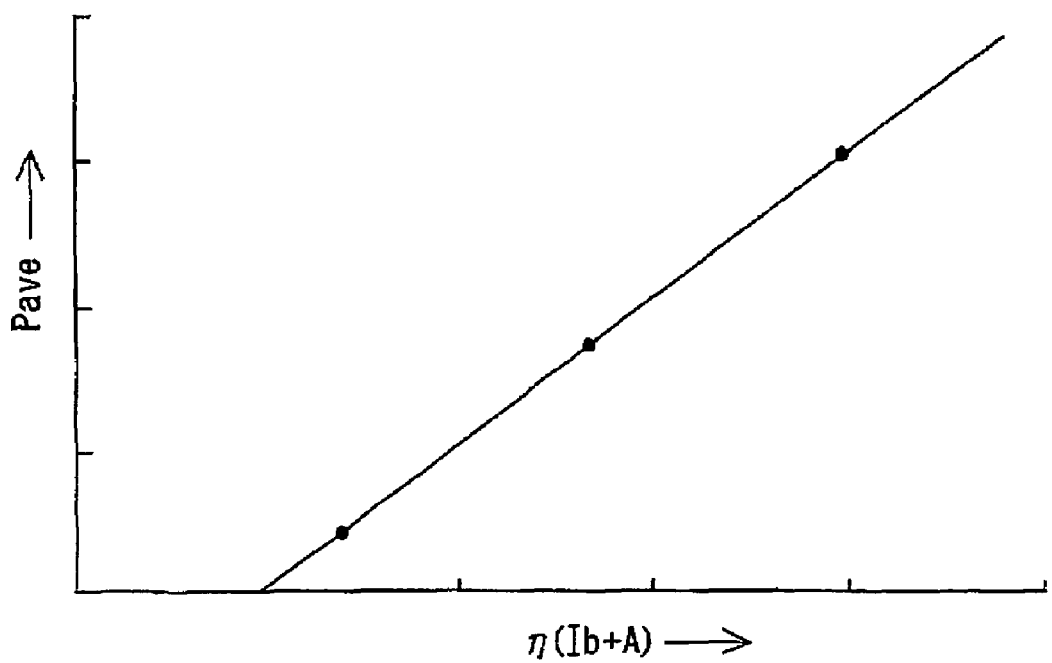
FIG. 7 is a schematic characteristic diagram showing a relation of $\eta(I_b+A)$ with respect to changing of the average optical output $P_{ave}$.

FIG. 7 shows a relation of $\eta(I_b+A)$ with respect to changing of the average optical output $P_{ave}$. A characteristic shown in FIG. 7 is described as a following equation.

$$P_{ave} = \eta(I_b - I_{th}) \quad (7)$$

The above equation (7) shows that the average optical output $P_{ave}$ and $\eta(I_b+A)$ have a relation of a linear expression including a slope 1. Therefore, when $\eta(I_b+A)=B'$ is target amount B, if an amount of the average optical output is determined as a target amount $P_{tar}$, the average optical output $P_{ave}$ is described as a following equation. In this case, the target value $P_{tar}$ is preliminarily set.

$$P_{ave} = \eta(I_b+A) + P_{tar} - B \quad (8)$$

Using the above equation (8), the average optical output $P_{ave}$ can be calculated by the MPU 23.

Figure 8:
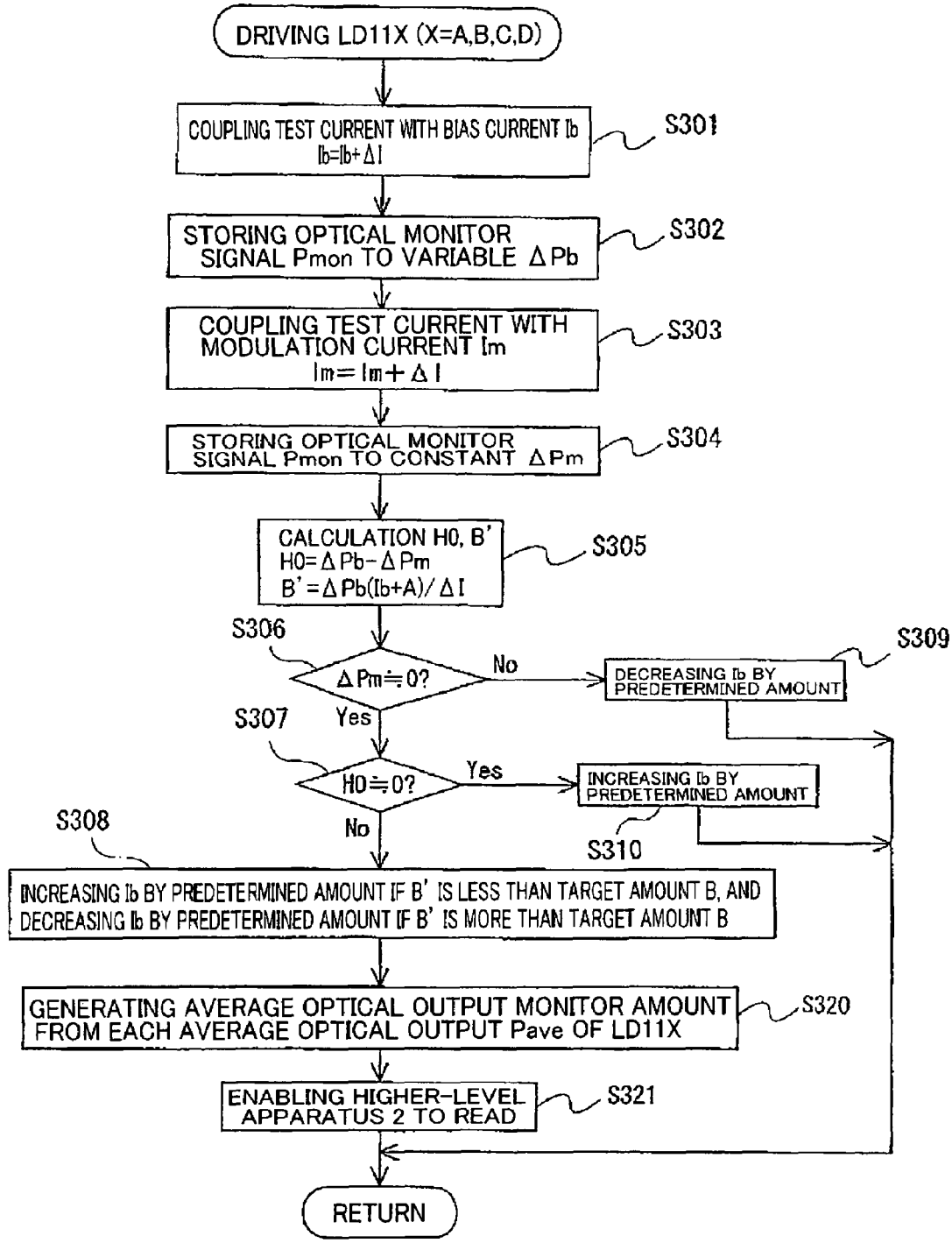
FIG. 8 is a flowchart showing a process in the second exemplary embodiment according to the present invention.

FIG. 8 shows a process in the second exemplary embodiment. In FIG. 8, since steps S301-S310 are the same as steps described in the first exemplary embodiment, an explanation is omitted. After the process of the step S308 mentioned in the first exemplary embodiment is finished, the MPU 23 calculates the average optical output $P_{ave}$ by using the above equation (8) (S320) and stores the amount in a predetermined address of the memory 23a. The higher-level apparatus 2 can read the amount of the average optical output $P_{ave}$ of the LDs 11A-11D by accessing the predetermined address of the memory 23a through the interface circuit 26 (S321).

According to the second exemplary embodiment, since the average optical output $P_{ave}$ of each LDs 11A-11D can be provided to the higher-level apparatus 2 from the laser control apparatus 1, for example, an operating state of the laser control apparatus 1 can be monitored by the higher-level apparatus 2. Other advantages are the same as the first exemplary embodiment.

Exemplary Embodiment 3

Constitution of Laser Control Apparatus

In the laser control apparatus in a third exemplary embodiment according to the present invention, an optical modulation amplitude $P_m$ of the optical output P is also controlled to be kept constant, in addition to controlling to keep the average optical output $P_{ave}$ constant in the first exemplary embodiment. All of the processes, movements, and constitutions other than that explained above are the same as the first exemplary embodiment.

As shown in FIG. 2, the optical modulation amplitude $P_m$ is in proportion to the differential efficiency η and the modulation current $I_m$. Consequently, in this exemplary embodiment, the modulation currents $I_{m1}$-$I_{m4}$ are controlled by the MPU 23 so that a product ($\eta I_m$) of the detected differential efficiency η and the known modulation current $I_m$ will become a predetermined amount.

According to the third exemplary embodiment, since both the average optical output $P_{ave}$ and the optical modulation amplitude $P_m$ are controlled to be kept constant, even if a temperature change occurs, the optical outputs $P_0$ and $P_1$ can be kept constant.

Meanwhile, the third exemplary embodiment can be based on the second exemplary embodiment.

Other Exemplary Embodiments

Although the invention has been described with respect to specific exemplary embodiments for complete and clear disclosure, the appended claims are not to be thus limited but are to be construed as embodying all modifications and alternative constructions that may occur to one skilled in the art which fairly fall within the basic teaching herein set forth.

For example, the above exemplary modifications may be made alone or in any combination thereof. Further, although the exemplary embodiments are explained by the four LDs 11A-11D, the number of the LDs can be modified arbitrarily.

Additionally, although the exemplary embodiments are explained that the LDs 11A-11D are driven at the same time, for example, the LDs 11A-11D can be driven one-by-one in time division.

Further, it is noted that Applicant's intent is to encompass equivalents of all claim elements, even if amended later during prosecution.

What is claimed is:

1. A laser control apparatus, comprising:
   a plurality of laser elements;
   a photodetector for monitoring optical outputs of said laser elements;
   a modulation circuit for modulating with respect to each of said laser elements based on data;
   a first drive source for applying a bias current to each of said laser elements;
   a second drive source for generating a modulation current in said modulation circuit, said modulation current being applied to each of said laser elements; and
   a controller for controlling said first drive source and said second drive source to couple an amount of a variation of a drive current as a test current to said bias current and said modulation current, and for controlling said bias current according to an amount of variation of said optical output which occurs by coupling of said test current and an amount of said bias current.

2. A laser control apparatus according to claim 1, wherein:
   said controller provides an amount of monitoring of an average optical output of each laser element according to said amount of variation of said optical output which occurs by coupling of said test current and said bias current to a higher-level apparatus.

3. A laser control apparatus according to claim 1, wherein:
   said controller controls an amplitude of said modulation current to keep a modulation amplitude of said optical output of each laser element constant according to said amount of variation of said optical output which occurs by coupling of said test current.

4. A laser control apparatus according to claim 1, wherein:
   said controller controls said laser elements individually by time division.

5. A laser control method for monitoring an optical output of a plurality of laser elements by a photodetector and driving said laser elements by a drive current including a bias current and a modulation current based on a monitored optical output and data, comprising:
   driving said laser elements individually by coupling an amount of a variation of a drive current as a test current to said drive current;
   monitoring said optical output of said laser elements by said photodetector; and
   controlling said bias current according to an amount of variation of said optical output which occurs by coupling of said test current and said bias current for keeping an average optical output of said laser elements constant.

6. A laser control method according to claim 5, further comprising:
   providing an amount of monitoring of said average optical output of each laser element according to said amount of variation of said optical output which occurs by coupling of said test current and said bias current to a higher-level apparatus.

7. A laser control method according to claim 5, further comprising:
   controlling an amplitude of said modulation current to keep a modulation amplitude of said optical output of each laser element constant according to said amount of variation of said optical output which occurs by coupling of said test current.

8. A laser control method according to claim 5, further comprising:
   controlling said laser elements individually by time division.

* * * * *